United States Patent
Solana de Quesada et al.

[11] Patent Number: 6,134,247
[45] Date of Patent: Oct. 17, 2000

[54] BROADBAND LINE INTERFACE CIRCUIT

[75] Inventors: Juan Ignacio Solana de Quesada; Jose Gonzalez Torres, both of Madrid, Spain

[73] Assignee: Telefonica de Espana, S.A., Madrid, Spain

[21] Appl. No.: 08/958,334

[22] Filed: Oct. 27, 1997

[30] Foreign Application Priority Data

Nov. 19, 1996 [ES] Spain ..................................... 9602435

[51] Int. Cl.[7] .................................. H04J 3/06; H04J 3/02
[52] U.S. Cl. ............................................ 370/516; 370/537
[58] Field of Search ..................................... 370/395, 244, 370/532, 533, 535, 536, 537, 538, 539, 359, 419, 463, 907, 465, 516, 517

[56] References Cited

U.S. PATENT DOCUMENTS

| | | | |
|---|---|---|---|
| 5,091,907 | 2/1992 | Wettengel | 370/535 |
| 5,237,561 | 8/1993 | Pyhalammi | 370/244 |
| 5,384,774 | 1/1995 | Martin et al. | 370/395 |
| 5,398,241 | 3/1995 | Witchey | 370/535 |
| 5,483,534 | 1/1996 | Ohki et al. | 370/535 |

*Primary Examiner*—Chau Nguyen
*Assistant Examiner*—Chiho Andrew Lee
*Attorney, Agent, or Firm*—Jacobson, Price, Holman & Stern, PLLC

[57] ABSTRACT

A broadband line interface circuit has a transmission module and a reception module. The transmission module has a parallel-to-serial converter 11 that receives data from a multiplexer 14 that multiplexes data from one or more input data tributaries. The transmission module also has a randomizer 15, a transmission clock generator 12, and a parity generator 13. The receiver module has a serial-to-parallel converter 33 that receives data under control of a reception clock generator 34. The serial-to-parallel converter sends parallel data to a demultiplexer 36 and to a parity verification block 32. A derandomizer 37 is connected with the demultiplexer 36, which demultiplexes the data onto one or more output data tributaries.

12 Claims, 2 Drawing Sheets

BROADBAND LINE INTERFACE CIRCUIT

REFERENCE TO FOREIGN APPLICATION

The present application claims priority to Spanish patent application 9 602 435, filed Nov. 19, 1996, which is incorporated herein by reference in its entirety.

BACKGROUND OF THE INVENTION

1. Field of the Invention

This invention has its application in the field of telecommunications, more specifically in the transport and switching layers of the synchronous digital hierarchy (SDH) and of the broadband integrated services digital network (B-ISDN). More specifically, the present invention relates to broadband line interface circuits used in equipment of broadband integrated services digital networks (B-ISDN) or of the synchronous digital hierarchy (SDH).

2. Related Art

There exist commercial products that perform serial-to-parallel and parallel-to-serial conversion, as well as the possibility, by means of discrete components, of performing regeneration section termination, and synchronous multiplexing for interfaces of high-speed binary systems. However, known systems performing these functions require complex, bulky circuitry with high power consumption.

The broadband line interface circuit (IC) according to the invention solves problems associated with known systems, by presenting a new architecture that performs these functions with reduced circuit complexity, smaller size, and reduced power consumption. This achievement reduces the cost of equipment for transmitting and switching on broadband integrated services digital networks (B-ISDN) and of the synchronous digital hierarchy (SDH).

SUMMARY OF THE INVENTION

The broadband line interface circuit according to the invention constitutes a novelty in its field, because, with its characteristics, there is a new solution for broadband line interface circuits used in the equipment of the terminal section (where the signal is multiplexed/demultiplexed and regenerated) of the broadband integrated services digital network (B-ISDN), or of the synchronous digital hierarchy (SDH).

More specifically, the inventive broadband line interface circuit performs parallel-to-serial and serial-to-parallel conversion, multiplexing and demultiplexing a plurality of streams of synchronous frames into a single serial stream, suitable for transmission in optical fiber links. The invention has two modules, a transmission module and a reception module.

The transmission module performs synchronous multiplexing, generation of regeneration section parity, line and terminal randomization, and parallel-to-serial conversion. The preferred embodiment of the transmission module includes a parity generator, a randomizer, a transmission clock generator, a multiplexer, and a parallel-to-serial converter.

The parity generator calculates the regeneration section parity on all the bytes of each synchronous frame transmitted after synchronous multiplexing and line randomization. The calculated value of the parity in each frame is inserted in the field corresponding to the parity of the regeneration section of the following frame, prior to line randomization. The position that the field occupies is determined by a signal that is a primary input to the transmission module.

The randomizer performs terminal randomization and line randomization. Terminal randomization is performed independently on each of the tributaries that are multiplexed synchronously. Line randomization is performed on the global stream of bytes, after the tributaries have been multiplexed. The object of terminal randomization is to facilitate interconnection of the inventive interface with other devices of lower speed that may use signals with PECL levels (Positive Emitter Coupled Logic), which have frame levels shifted relative to the ECL levels (Emitter Coupled Logic) that are preferably used in the inventive system for input of tributary data.

The sequence that the two randomization steps generate is restarted in each synchronous frame with a transmission frame start signal. A signal indicates to the randomizer, the bytes that belong to the first row of the regeneration section tally of each synchronous frame, which do not have to undergo any randomization process. Terminal and line randomization may be disabled by a disable signal that is a primary input to the transmission module.

The transmission clock generator generates and distributes, for the remainder of the transmission module, clocks derived from a transmission line frequency that is a primary input to the transmission module, the transmission line frequency signal being provided at differential ECL logic levels. The derived clocks include a transmission byte clock used internally in the circuit, and a transmission tributary clock that is a primary output of the transmission module.

The multiplexer transforms the group of byte streams from the selected tributaries into a single multiplexed stream for transmission. The number of tributaries is selected by means of a combination of signals that are primary inputs to the transmission module. The byte streams of the selected tributaries are also input to the transmission module via the associated primary inputs. Synchronous multiplexing is performed by successively inserting one byte of the higher order tributary, then one byte of the tributary of the next-higher order, and so one, successively.

The parallel-to-serial converter transforms the stream of multiplexed bytes into a stream of serial bytes. The parallel-to-serial converter generates the primary outputs of the output transmission clock circuit and transmission data output, appropriately aligned for use by external circuitry. Both output signals preferably use differential ECL logic levels (in which corresponding negated signals are also provided).

The parallel-to-parallel converter also performs the function of a remote loop, which is governed by a control signal that is a primary input to the module. When the remote loop is activated, the data and the high speed reception clock are sent directly to the data and transmission clock output lines. Establishment of loops in particularly useful to perform tests of the network over corresponding interfaces.

The reception module performs synchronous demultiplexing, regeneration section parity verification, line and terminal randomization, and serial-to-parallel conversion. The reception module preferably includes a parity verification block, a derandomizer, a reception clock generator, a demultiplexer, and a serial-to-parallel converter.

The parity verification block calculates regeneration section parity of the synchronous frames received, and compares it with the regeneration section parity field received. The result of the comparison is substituted in the regeneration section parity field itself, and if the compared parities are equal, the result of the comparisons is 00'H. The regeneration section parity field position is identified by means of a signal that is a primary input to the module.

The derandomizer performs both terminal derandomization and line derandomization. Terminal derandomization is performed independently on each of the tributaries that are synchronously demultiplexed, whereas line derandomization is performed on the global stream of bytes before they are demultiplexed. Terminal derandomization facilitates interconnection of the inventive interface with other devices of lower speed. The sequence that the two steps of derandomization generate is restarted in each synchronous frame with a reception frame start signals that is a primary input to the module. This same reception frame start signal identifies the bytes that belong to the first row of the synchronous frame regeneration section tally, which do not have to undergo any derandomization process. Both derandomization steps may be disabled by means of a disable signal that is a primary input to the module.

The reception clock generator generates and distributes to the remainder of the reception elements, clocks derived from the reception line frequency, which is a primary input to the module, one that uses differential ECL logic levels. The derived clocks include an internal reception byte clock, and a reception tributary clock that is a primary output of the module.

The demultiplexer transforms a stream of received bytes into a number of streams directed to corresponding tributaries. The number of tributaries is selected by means of signals that are primary input to the module. The streams of selected tributaries bytes leave the device via appropriate primary outputs. Synchronous demultiplexing is performed by successively extracting, from the stream of received bytes, one byte directed to the high order tributary, followed by another byte of the next-higher order, and so one, successively.

The serial-to-parallel converter transforms the serial bit stream, received on the primary high-speed data input, into a stream of bytes. The primary high-speed data input signal uses differential ECL logic levels (in which a corresponding negated signal also appears as a primary input to the module). To transform the serial stream of bits into a stream of bytes, there is a two-state state machine. The two states are LOCKED and UNLOCKED, which are controlled by means of a plurality of primary input signals.

In the UNLOCKED state, the serial-to-parallel converter searches for a synchronous frame alignment sequence. When the synchronous frame alignment sequence is found, the converter aligns the bytes it generates so that the alignment sequence is transformed into a pair of bytes, and the machine changes to the LOCKED state. Thereafter, the machine retains the byte phase captured with the alignment sequence, and remains in this state as long as it is not informed, via a control signal, that it must perform a new alignment process. If that occurs, the machine changes to the UNLOCKED state and restarts the process.

The alignment process may be disabled by a control signal that is a primary input to the module. When this happens, the serial-to-parallel converter generates the bytes from the serial bit stream completely independent of detection of the alignment sequence of the synchronous frame.

The serial-to-parallel converter also performs the function of a local loop, in which the primary high-speed output branches from the high-speed data transmission wire, in accordance with a control signal that is a primary input to the module. Establishment of loops is useful to perform tests on the network over corresponding interfaces.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which.

DETAILED DESCRIPTION OF THE PREFERRED EMBODIMENTS

Figure 1:
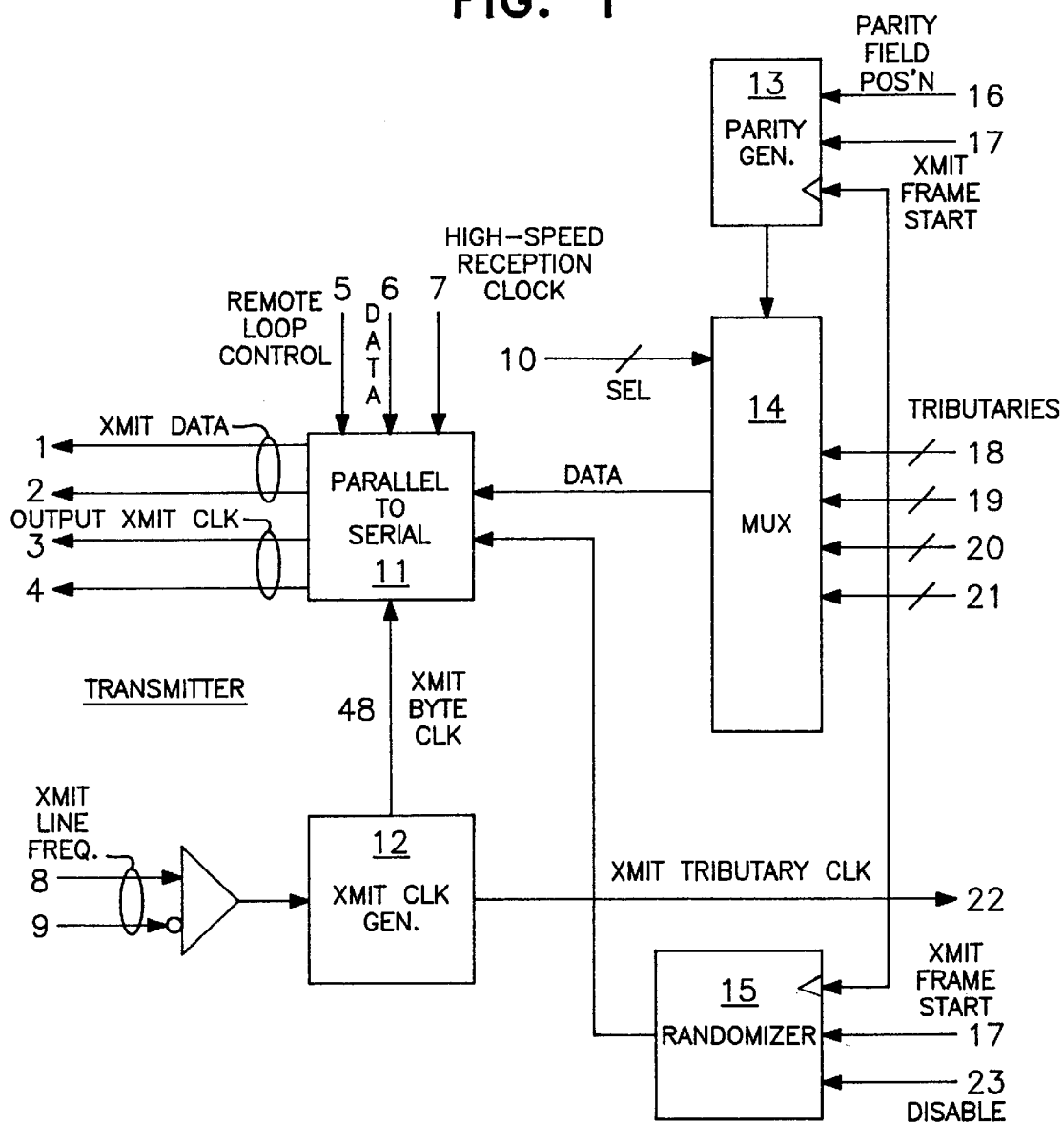
FIG. 1 is a block diagram of a transmission module of the broadband line interface circuit according to a preferred embodiment of the present invention.

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

A preferred embodiment of the invention performs serial-to-parallel and parallel-to-serial conversion for ratings up to 622 Mb/s, and regeneration section termination. It also performs synchronous multiplexing of up to four tributaries, including frame alignment detection, generation and verification of regeneration section parity, and line randomization and derandomization.

Figure 2:
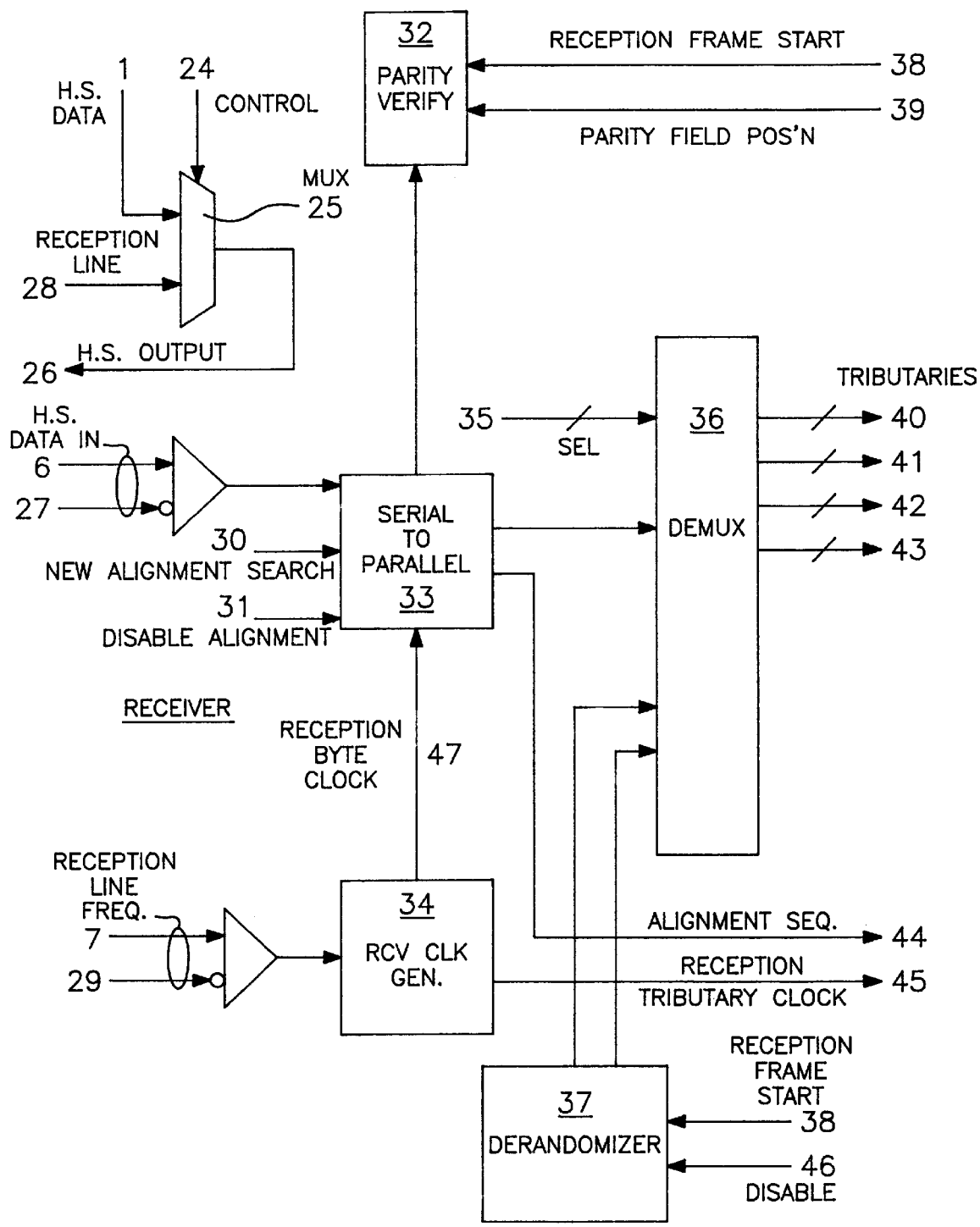
FIG. 2 is a block diagram of the reception module of the broadband line interface circuit according to a preferred embodiment of the present invention.

The drawing figures illustrate how the preferred embodiment of the inventive broadband line interface circuit is divided into two modules, one for transmission and the other for reception, depicted in FIGS. 1 and 2, respectively.

The transmission module depicted in FIG. 1 performs synchronous multiplexing, generation of the regeneration section parity, line and terminal randomization, and parallel-to-serial conversion, in accordance with recommendations G.707, G.708, and G.709 of the ITU-T. The reception module depicted in FIG. 2 performs synchronous demultiplexing, verifies regeneration section parity (B1), performs terminal and line derandomization, and serial-to-parallel conversion, in accordance with the aforementioned recommendations G.707, G.708, and G.709 of the ITU-T.

FIG. 1 shows an embodiment of the inventive transmission module including a parity generator 13, a randomizer 15, a transmission clock generator 12, a multiplexer 14, and a parallel-to-serial converter 11.

The parity generator 13 calculates the regeneration section parity B1 on all the bytes of each synchronous frame transmitted after synchronous multiplexing and line randomization. The calculated value of the parity in each frame is inserted in the field corresponding to the parity of the regeneration section of the following frame, prior to line randomization. The position that the field occupies is indicated by a high-level active pulse of a signal 16 that is a primary input to the module.

Randomizer 15 performs both terminal randomization and line randomization. The two processes generate pseudo-random sequences in accordance with the primitive polynomial:

$$g(x)=x^7+x^6+1$$

Terminal randomization is performed independently on each of the tributaries that are multiplexed synchronously, whereas line randomization is performed in the global stream of bytes, after the tributaries have been multiplexed. Terminal randomization facilitates interconnection of the invention with other devices of lower speed that may use signals with PECL levels (Positive Emitter Coupled Logic), which in turn have frame levels shifted relative to the ECL levels preferably used on tributary inputs 18, 19, 20, and 21. Terminal randomization permits adaptation of frame levels by means of a simple pass capacitor, because of which the stream of randomized terminal data does not contain information in low frequencies. The sequence that the two randomization steps generate is restarted in each synchronous frame with a transmission frame start signal 17 that is a primary input to the module.

Signal 17, a transmission frame start signal, identifies, by means of an active-high pulse, the bytes that belong to the first row of the regeneration section tally of each synchronous frame, which, in accordance with recommendation G.708 of the ITU-T, do not have to undergo any randomization process. Both the terminal and line randomization processes may be disabled by a signal 23 that is a primary input to the module.

Transmission clock generator 12 generates and distributes, for the remainder of the transmission modules, clocks derived from transmission line frequency 8, which is a primary input of the device, and which uses differential ECL logic levels (in which a negated signal 9 also appears as input). The derived clocks include a transmission byte clock 48 that is used internally in the circuit, and a transmission tributary clock 22 that is a primary output of the module.

Multiplexer 14 transforms groups of byte streams from selected tributaries into a signal multiplexed stream, for transmission. The number of tributaries is selected by means of a combination of signals 10 that are primary inputs to the module. The combination of signals indicates the following:

Combination 00 indicates that there is a single tributary.
Combination 01 indicates that there are two tributaries.
Combination 10 indicates that there are three tributaries.
Combination 11 indicates that there are four tributaries.

The byte streams of the selected tributaries are introduced into the device via primary inputs 21, 20, 19, and 18, with the primary input 21 being that of the higher order. Synchronous multiplexing is performed by inserting one byte of the higher order tributary, one byte of the tributary of the next-higher order, and so one, successively.

Parallel-to-serial converter 11 transforms the stream of multiplexed bytes into a stream of serial bytes. The parallel-to-serial converter 11 generates the primary outputs of the output transmission clock circuit 3 and that of the transmission data 1, appropriately aligned for use by the external circuitry. Both signals use differential ECL logic levels for which reason corresponding negated signals 4 and 2, respectively, are also provided.

The parallel-to-serial converter 11 also performs the function of a remote loop, governed by a control signal 5 that is a primary input to the module. When a remote loop is activated, data wires 6 and high-speed reception clock wires 7 are connected directly to transmission data wire 1 and transmission clock wire 3, respectively. Establishment of loops is particularly useful to perform tests of the network over corresponding interfaces.

FIG. 2 shows an embodiment of the inventive reception module including a parity verification block 32, a derandomizer 37, a reception clock generator 34, a demultiplexer 36, and a serial-to-parallel converter 33.

Parity verification block 32 calculates the regeneration section parity B1 on the synchronous frames received, and compares it with the regeneration section parity field received. The result of the comparison is substituted in the regeneration section parity field itself, and if the compared parities are equal, the result of the comparison is 00'H. The regeneration section parity field position is identified by an active-high pulse of signal 39 that is a primary input to the module.

Derandomizer 37 performs both terminal derandomization and line derandomization. Terminal derandomization is performed independently on each one of the tributaries that are synchronously demultiplexed, whereas line derandomization is performed on the global stream of bytes before they are demultiplexed. The two derandomization steps generate pseudo-random sequences in accordance with the primitive polynomial:

$$g(x)=x^7x^6+1.$$

Terminal derandomization facilitates interconnection of the inventive interface with other devices of lower speed, the same as randomizer 15 of the transmission module. The sequence that the two steps of derandomization generate is restarted in each synchronous frame with a reception frame start signal 38 that is a primary input to the module. This same signal identifies the bytes that belong to the first row of the synchronous frame regeneration section tally, which, in accordance with recommendations G.708 of the ITU, do not have to undergo any derandomization process. Both derandomization processes may be disabled by a signal 46 that is a primary input to the module.

Reception clock generator 34 generates and distributes, for the remainder of the reception module, clocks derived from a reception line frequency 7 that is a primary input to the module and that uses differential ECL logic levels, for which reason a corresponding negated signal 29 is also provided. The derived clocks include an internal reception byte clock 47, and a reception tributary clock 45 that is a primary output of the module.

Demultiplexer 36 transforms a stream of received bytes into a number of streams directed to corresponding tributaries. The number of tributaries is selected by a combination of two signals 35 that are primary inputs to the module. The combination of signals indicates the following:

Combination 00 indicates that there is a single tributary.
Combination 01 indicates that there are two tributaries.
Combination 10 indicates that there are three tributaries.
Combination 11 indicates that there are four tributaries.

Thus, in the illustrated embodiment, it is possible to select four tributaries. The streams of bytes of the selected tributaries leave the device via appropriate primary outputs 43, 42, 41, and 40, with synchronous demultiplexing being performed by successively extracting from the stream of bytes received, one byte directed to the higher-order tributary 43, followed by another byte directed to the next-higher order tributary 42, and so on, successively.

Serial-to-parallel converter 33 transforms the serial bit stream, received at the primary high speed data input 6, into a stream of bytes. The high-speed data input signal 6 uses differential ECL logic levels, for which reason a negated signal 27 is also provided as a primary input. To transform the serial stream of bits into a stream of bytes, there is a two state machine, whose states are LOCKED and UNLOCKED. The states are controlled by two signals 30 and 31 that are primary inputs to the circuit.

In the UNLOCKED state, the serial-to-parallel converter 33 searches for the appearance of a synchronous frame alignment sequence, such as (for example) 1111011000101000'B. When the synchronous frame alignment sequence is found, the converter aligns the bytes it generates so that the above bit sequence is transformed into a pair of bytes F6'H and 28'H, and the machine changes to the LOCKED state. Thereafter, the machine retains the byte phase captured with the first alignment sequence and remains in this state as long as it is not informed, via an active-low pulse in control signal 30, that it must perform a new alignment process.

Subsequent alignment sequences detected in the reception stream produce an active-high pulse in primary output 44, so that the pulse coincides with the interval of clock signal 45, immediately following the byte with the value 28'H that the second byte of the alignment sequence presents. After the pulse in signal 30, the machine changes to the UNLOCKED state and restarts the process.

The alignment process may be disabled by a control signal 31 that is a primary input to the module. When this occurs, control signal 31 is at a low level, and the converter 33 generates bytes from the serial bit stream completely independently of detection of the alignment sequence of the synchronous frame.

In addition, the serial-to-parallel converter 33 performs the function of a local loop, and the primary high-speed output 26 branches, via the multiplexer 25, from the high-speed data transmission wire 1, or from the reception line, in accordance with the value of a control signal 24 that is a primary input to the module. Establishment of loops is useful to perform tests on the network over corresponding interfaces.

It is not deemed necessary to make this description more extensive for any person skilled in the art to understand the scope of the invention and the advantages derived therefrom. The materials, shape, size, and disposition of the elements may be altered provided that presupposes no change in the essence of the invention. The terms in which this description has been made must always be interpreted broadly and non-restrictively. Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

What is claimed is:

1. A broadband line interface circuit comprising:
   a) a transmission module, including:
      1) a multiplexer for receiving data from at least one input data tributary;
      2) a parity generator for calculating a byte parity of data passing through the multiplexer, and for inserting a resulting byte parity calculation into a predetermined field of a data frame;
      3) a randomizer for performing randomization on the data that had passed through the multiplexer, the randomizer including:
         means for performing terminal randomization independently on each input data tributary that is synchronously multiplexed by the multiplexer;
         means for performing line randomization on a global stream of bytes, after the tributaries have been multiplexed by the multiplexer; and
         a disable input for receiving a disable signal that is a primary input of the transmission module, for disabling both the means for performing the terminal randomization and the means for performing the line randomization;
      4) a parallel-to-serial converter for receiving multiplexed data from the multiplexer and for converting it to a serial data stream that is transmitted from the transmission module; and
      5) a transmission clock generator for generating transmission clocks to govern timing of transmission of the serial data from the transmission module; and
   b) a reception module, including:
      1) a reception clock generator for generating reception clocks to govern timing of reception of receiving serial data;
      2) a serial-to-parallel converter, controllably timed by one of the reception clocks, for converting the received serial data into parallel data;
      3) a parity verification block for verifying byte parity in the received serial data;
      4) a demultiplexer for demultiplexing parallel data from the serial-to-parallel converter into at least one output data tributary; and
      5) a derandomizer for derandomizing the data passing through the demultiplexer.

2. The circuit of claim 1, wherein the parity generator includes:
   means for calculating regeneration section parity on bytes of transmitted frames, after the multiplexer has performed synchronous multiplexing and the randomizer has performed line randomization.

3. The circuit of claim 1, wherein the transmission clock generator includes:
   means for generating and distributing, to a remainder of the transmission module, derived clocks including (1) a transmission byte clock that is internal to the transmission module and (2) a transmission tributary clock that is a primary output of the transmission module.

4. The circuit of claim 1, wherein the parallel-to-serial converter includes:
   remote loop means for connecting a data line and a high-speed reception clock with, respectively, a transmission data output and a transmission clock output that are primary outputs from the transmission module.

5. The circuit of claim 1, wherein the reception clock generator includes:
   means for generating and distributing, to a remainder of the reception module, derived clocks including (1) a reception byte clock internal to the reception module and (2) a reception tributary clock constituting a primary output of the receiver module.

6. The circuit of claim 1, wherein the serial-to-parallel converter includes a state machine having first and second states, wherein:
   1) the first state includes searching for occurrence of a synchronous frame alignment sequence;
   2) the second state including maintaining a captured byte phase and remaining in the second state until a control signal informs the state machine of a new alignment search; and
   3) the state machine includes a primary input to the receiver module that can disable an alignment process.

7. A broadband line interface circuit comprising:
   a) a transmission module, including:
      1) a multiplexer for receiving data from at least one input data tributary;
      2) a parity generator for calculating a byte parity of data passing through the multiplexer, and for inserting a resulting byte parity calculation into a predetermined field of a data frame;

3) a randomizer for performing randomization on the data that has passed through the multiplexer;

4) a parallel-to-serial converter for receiving multiplexed data from the multiplexer and for converting it to a serial data stream that is transmitted from the transmission module; and 5) a transmission clock generator for generating transmission clocks to govern timing of transmission of the serial data from the transmission module; and b) a reception module, including:

1) a reception clock generator for generating reception clocks to govern timing of reception of received serial data;

2) a serial-to-parallel converter, controllably timed by one of the reception clocks, for converting the received serial data into parallel data;

3) a parity verification block for verifying byte parity into the received serial data;

4) a demultiplexer for demultiplexing parallel data from the serial-to-parallel converter into at least one output data tributary; and 5) a derandomizer for derandomizing the data passing through the demultiplexer, the derandomizer including:

means for performing terminal derandomization independently on each of the output data tributaries that are synchronously demultiplexed;

means for performing line derandomization on a global stream of bytes before the bytes are demultiplexed; and a disable signal input, constituting a primary input of the receiver module, for receiving a disable signal that disables both the means for performing terminal derandomization and the means for performing line derandomization.

8. The circuit of claim 7, wherein the parity generator includes:

means for calculating regeneration section parity on bytes of transmitted frames, after the multiplexer has performed synchronous multiplexing and the randomizer has performed line randomization.

9. The circuit of claim 7, wherein the transmission clock generator includes:

means for generating and distributing, to a remainder of the transmission module, derived clocks including (1) a transmission byte clock that is internal to the transmission module and (2) a transmission tributary clock that is a primary output of the transmission module.

10. The circuit of claim 7, wherein the parallel-to-serial converter includes:

remote loop means for connecting a data line and a high-speed reception clock with, respectively, a transmission data output and a transmission clock output that are primary outputs from the transmission module.

11. The circuit of claim 7, wherein the reception clock generator includes:

means for generating and distributing, to a remainder of the reception module, derived clocks (1) a reception byte clock internal to the reception module and (2) a reception tributary clock constituting a primary output of the receiver module.

12. The circuit of claim 7, wherein the serial-to-parallel converter includes a state machine having first and second states, wherein:

1) the first state includes searching for occurrence of a synchronous frame alignment sequence;

2) the second state includes maintaining a captured byte phase and remaining in the second state until a control signal informs the state machine of a new alignment search; and 3) the state machine includes a primary input to the receiver module that can disable an alignment process.

* * * * *